United States Patent [19]

Maigret et al.

[11] 3,829,709

[45] Aug. 13, 1974

[54] SUPPLY REVERSAL PROTECTON CIRCUIT

[75] Inventors: Robert Maigret, Warwick; Geoffrey King, Coventry, R.I.

[73] Assignee: Micro Components Corporation, Cranston, R.I.

[22] Filed: Aug. 31, 1973

[21] Appl. No.: 393,472

[52] U.S. Cl. .................... 307/202, 307/303, 357/35, 357/48, 357/51

[51] Int. Cl. ............................................ H01l 19/00

[58] Field of Search ......... 307/202, 303; 317/235 E, 317/235 V

[56] References Cited

UNITED STATES PATENTS

| | | | |
|---|---|---|---|
| 3,509,446 | 4/1970 | Mullaly | 307/303 |
| 3,534,237 | 10/1970 | Ananiades | 307/303 |
| 3,541,357 | 11/1970 | Kram | 307/303 |
| 3,562,547 | 2/1971 | Brode et al. | 307/202 |
| 3,649,887 | 3/1972 | Keller et al. | 307/303 |

OTHER PUBLICATIONS

Davis, IEEE Journal of Solid State Circuits, Vol. SC8, No. 6, Dec. 1973, pp. 395 and 419–427.

*Primary Examiner*—Rudolph V. Rolinec
*Assistant Examiner*—William D. Larkins

[57] ABSTRACT

A battery powered monolithic integrated circuit is described protected against accidental reversal of the battery in its holder. The protection is obtained by including a PNP lateral transistor in the circuit, connecting the emitter-base of the protection transistor in series with the collector of an NPN transistor, and connecting the protection transistor collector to the N pocket of a resistor included in the circuit.

5 Claims, 5 Drawing Figures

SUPPLY REVERSAL PROTECTON CIRCUIT

This invention relates to a circuit protected against reversal of its power supply, and in particular to bipolar integrated circuits powered by battery cells and protected against accidental insertion backwards of the battery cell into its holder.

Electrical equipment incorporating bipolar integrated circuits where power is supplied by mercury disc, penlight or standard flashlight type battery cells, which can be inserted backwards into their holders, are extremely vulnerable to permanent damage should the power source thus be accidentally reversed. The reasons for this are as follows. The conventional monolithic integrated circuit employs NPN transistors and P-type difused resistors serving as a transistor collector load or as parts of voltage dividers. In the typical situation wherein the wafer comprises an N epitaxial layer on a P substrate, the NPN transistor and the P resistor are built into N pockets isolated by P walls in the epitaxial layer. When the N collector of the transistor, which includes the N pocket, is connected directly to the positive terminal of the power supply, this places the N pocket to P substrate isolation diode directly across the supply terminals, since the P substrate is conventionally connected to the most negative potential point to maintain the isolation diode reverse biased at all times. Similarly, the N pocket containing the P resistors must be connected to a potential point, usually the positive supply terminal, equal to or higher than the P resistor itself to prevent parasitic diode conduction and maintain isolation from other resistors that may be diffused in the same pocket. Also any resistor connected to positive must have its N pocket connected to the same or a more positive potential point. Thus, the N pocket to P substrate isolation diode of such resistors is also effectively across the supply terminals.

Under these conditions, should the power source be reversed, the isolation diodes become forward biased, conducting a high current that may deplete the power source, damage the integrated circuit, or both.

One known method for avoiding this problem is to insert a P-N protection diode in series with the positive supply terminal. Thus, supply reversal back-biases the diode limiting the undesirable current flow. This approach has several drawbacks. The integrated circuit operates at a lower voltage due to the voltage drop across the protection diode. When employing battery power, a higher cutoff voltage is required reducing effective battery life. Power is wasted in the protection diode. For a 3 volt system, approximately 25 percent of the available energy is lost. The effective power supply source impedance is increased, which may cause feedback circuits to be more difficult to stabilize.

Another possible method to avoid the problem is to incorporate protection P-N diodes into the circuit at specific points of need, for example, in series with NPN collectors, resistors connected to positive potentials, and resistor N pockets connected to positive potentials. However this scheme suffers from the drawbacks that resistors cannot be directly connected to the positive source. Thus, some accuracy must be sacrificed in voltage dividers to accommodate the protection diode. Moreover if a resistor connected to a positive potential provides base current for a transistor, such current will fall off rapidly at low supply voltages, since the voltage across the resistor is smaller than the voltage applied to the transistor collector by two forward diode drops.

The principal object of the invention is a circuit providing protection against battery reversal while retaining necessary isolation characteristics and allowing resistors to be connected directly to the positive supply terminal.

This and further objects and advantages of the invention are obtained in accordance with the invention by providing in the monolithic integrated circuit a lateral PNP transistor, connecting the base-emitter of the lateral PNP transistor in series with one or more N collectors of the active NPN transistors, and connecting the collector of the lateral PNP transistor to the N pocket containing the P resistor or resistors. As a result the N pocket is connected to the positive source via the lateral PNP transistor, which is operated in saturation. So long as the voltage drop across the saturated transistor is substantially less than necessary to forward bias a P-N diode, i.e., approximately 0.5 volts, proper resistor isolation and parasitic suppression will be maintained even if some of the resistors are connected directly to the positive source terminal. If the battery is accidentally inserted in the reverse manner, the negative supply terminal then becomes connected to the circuit through the P emitter of the lateral PNP transistor, which is thus rendered non-conductive blocking current flow into the circuit.

By providing sufficient base current to the lateral PNP transistor, its collector can be used to connect other circuitry to the source that would have otherwise required individual protection diodes. Thus the arrangement of the invention reduces the energy loss while increasing the effective available voltage. Moreover the arrangement of the invention is readily obtained using standard planar technology to provide the protection transistor.

Several exemplary embodiments of the invention will now be described in connection with the accompanying drawings, wherein.

Figure 1:
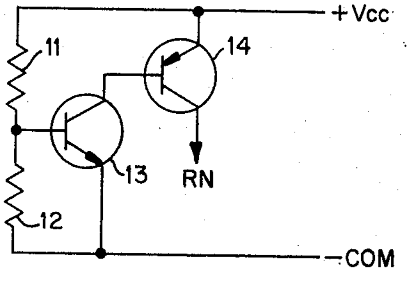
FIG. 1 illustrates a simple schematic circuit in accordance with the invention.
Figure 2:
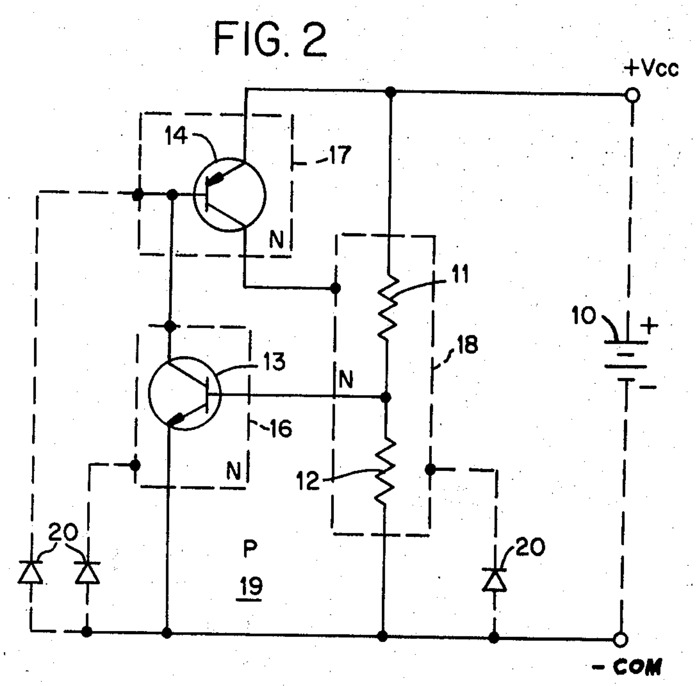
FIG. 2 is a schematic top view of a semiconducting wafer illustrating how the various circuit elements are located in isolated pockets.

FIG. 1 is a circuit schematic and FIG. 2 a diagrammatic of part of a monolithic integrated circuit to illustrate how the various circuit elements of FIG. 1 may be incorporated therein. For simplicity, input and output connections have been omitted. The circuit comprises a positive terminal designated +Vcc and a negative terminal designated −COM to be connected to a potential source such as a battery 10. The circuit includes a voltage divider formed by resistors 11 and 12 connected across the power supply and supplying base current to an active NPN transistor 13. The NPN transistor emitter is connected to the negative terminal. A PNP transistor 14 is provided, which constitutes the protection transistor. Its base is connected to the NPN collector, and its emitter is connected to the positive terminal. Its collector is connected to RN, designating the N pocket for the resistors. In the monolithic circuit embodiment depicted in FIG. 2, the NPN transistor 13 is incorporated in an N pocket 16, the protection transistor 14 in an N pocket 17, and tbe two resistors 11, 12 in a common N pocket 18, all in a common P substrate designated 19. The pockets are shown in dashed lines. Also shown in dashed lines are the isolation diodes 20 formed by the P-N junctions between each of the N pockets and the P substrate. With the power source connections as shown, all three isolation diodes are reverse biased. In the absence of the protection transistor 14, if the battery 10 were reversed, the isolation diodes 20 would become forward biased causing undesirable high current flow in the circuit. But with the protection transistor 14 present, its emitter-base diode becomes non-conductive blocking the undesirable current flow. By choosing appropriate working conditions, the protection transistor 14 is maintained in saturation. Thus the voltage drop across it is maintained below the diode drop of a P-N junction, ie., approximately 0.5 volts for silicon. This ensures proper isolation of the resistor pocket 18 which is connected to the collector of the protection transistor.

Figure 3:
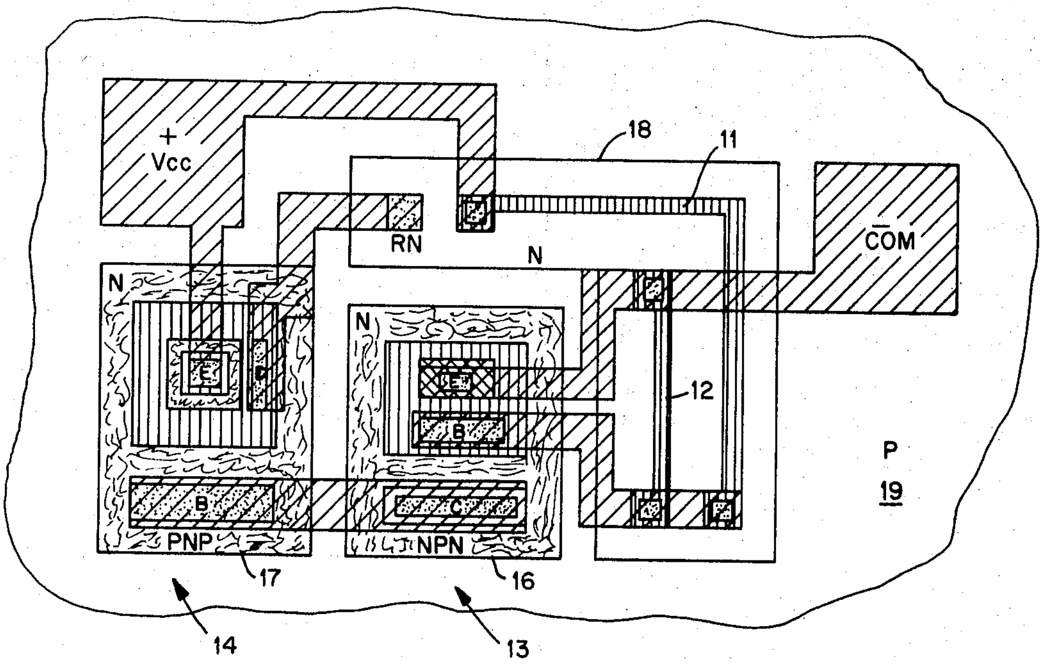
FIG. 3 is a top view showing how the circuit of FIG. 1 could actually be incorporated in a semiconductor wafer.
Figure 4:
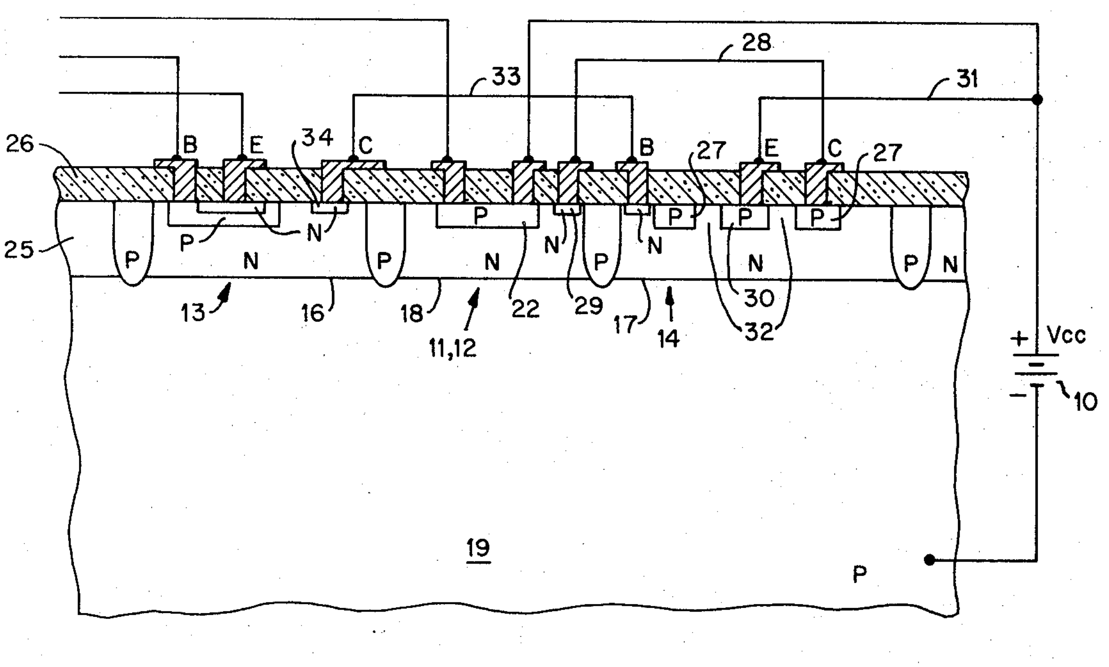
FIG. 4 illustrates standard planar technology for achieving a circuit similar to that shown in FIG. 1.

FIG. 3 is a top view showing how the circuit of FIG. 1 would appear in actual monolithic form. The same numerals are employed to designate corresponding parts. The letters E, B and C designate the connection points for the emitter, base and collector zones, respectively, of the transistors. The hatched sections interconnecting the various elements shown are the usual metallization lines and pads located on the usual protective oxide coating. The various circuit elements can be made by well-known standard planar technology. This is schematically illustrated in the cross-section shown in FIG. 4, wherein 19 designates the P substrate, 25 an N epitaxial layer, and 26 the usual oxide layer. The NPN transistor 13 is the usual double diffused transistor. An N sub-collector can be present if desired. The resistors 11, 12 are formed in the usual diffused P regions 22. The protection transistor 14 is a normal PNP lateral transistor. It need not exhibit a high gain. Only some of the connections are illustrated. As will be observed, the PNP collector, which is the annular diffused P zone 27, is connected 28 to the N pocket 18 housing the resistors 11, 12 via contact zone 29. The emitter 30 of the PNP transistor is connected 31 to Vcc, and the base 32 is connected 33 to the collector contact zone 34 of the NPN transistor 13.

Figure 5:
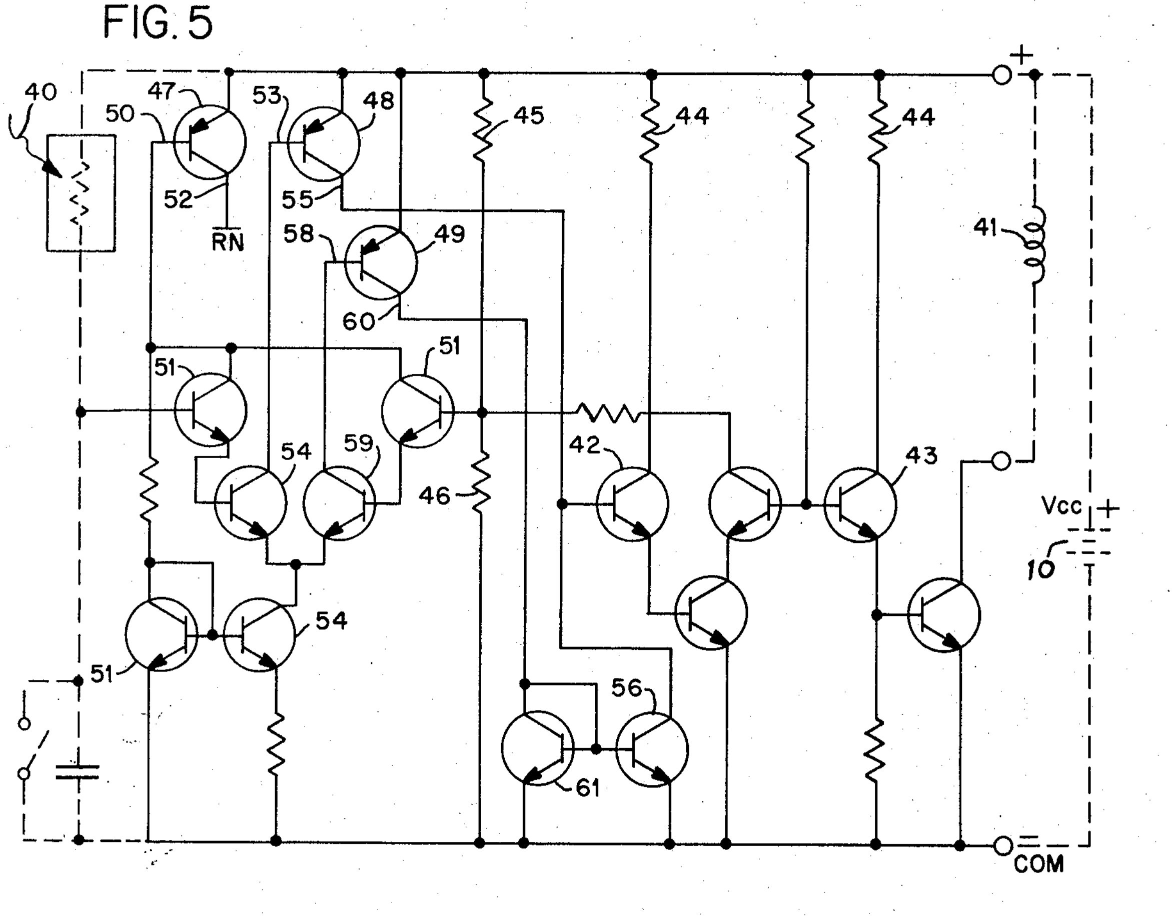
FIG. 5 is a schematic of a more complicated circuit utilizing the principles of the invention.

The circuits shown so far to illustrate the invention have been relatively simple. In practice however, many NPN active transistors and many resistors may be present, and several protection transistors can be employed. This is illustrat4d in FIG. 5, which shows a monolithic circuit in accordance with the invention used, for example, to control the shutter opening of a camera in accordance with the light reflected from the object being photographed. The input in this case is light from the object, designated 40, which irradiates a light-sensitive resistor, and the output load 41 is the coil of a suitable relay. The circuit illustrated in one form of a differential comparator, but the details thereof are not important except for the incorporation of the protection feature of the invention. Such cameras, as are well known, incorporate batteries to operate the electronically controlled shutter, and the circuit of the invention will protect such a circuit against damage due to accidental battery reversal in its holder. As will be observed, the circuit includes a number of active NPN transistors. Several of these transistors, designated 42, 43, have collector resistors, designated 44, connected directly to the positive source terminal. A voltage divider 45, 46 is connected across the battery supply.

The protection transistors for this circuit include three PNP transistors 47, 48 and 49. All three have their emitters connected to the positive terminal. The base 50 of the first 47 supplies power to the collectors of several of the NPN transistors 51, whereas the PNP collector 52 is connected to the N pocket, designated RN, containing the resistors shown in the circuit. The collectors of NPN transistors 54 and 59 are coupled to the bases of transistors 56 and 61 and 42 via lateral PNP transistors 48 and 49. This connection provides in the comparator circuit illustrated an active circuit function. In addition, because of the location of these PNP transistors, protection of transistors 54 and 59 against battery reversal is also obtained. In contrast, however, to transistor 47, PNP transistors 48 and 49 are not always operated in saturation, which is essential for transistor 47 due to its collector connection to the N pocket RN. All the NPN transistors 51, 54, 59, 61 whose collectors are to be connected to Vcc directly, do so via one of the protection transistors. Thus, should the battery be accidentally reversed, the protection transistors become blocked preventing excessive current flow in the circuits. The remaining active transistors not connected to the protection transistors are protected by a resistor in their collector circuit. The resistors in the circuit are isolated by connecting their N pocket to Vcc through the saturated protection transistor 47. Thus, for the circuit illustrated in FIG. 5, only one additional PNP transistor 47, easily made by standard techniques, was needed to provide complete protection of the entire circuit against battery reversal. The protection transistor 47 whose collector is connected to the resistor N pocket is located in the circuit such that under normal conditions sufficient base current flows to maintain the transistor 47 in saturation. Should this not be the case, then additional base current will have to be supplied to achieve saturation. This is readily accomplished as is well known by, for example, connecting its base to a voltage divider connected across the power supply to bias the transistor 47 into saturation.

It will be evident from the foregoing description that the principles described are applicable to all bipolar monolithic integrated circuits which depend upon a reverse-biased P-N junction as at least part of the isolation for the various circuit elements contained within a common semiconductor wafer, which circuits are to be used in primarily battery powered consumer-oriented electronic equipment wherein a non-sophisticated user may insert a fresh battery backwards.

While the invention has been described in connection with specific embodiments thereof, those skilled in the art will recognize that various modifications are possible within the principles enunciated herein and thus the present invention is not to be limited to the specific embodiments disclosed.

What is claimed is:

1. A monolithic integrated circuit comprising a semiconductive body having a P-type substrate and plural N-type surface pockets isolated from each other by P-N junctions, at least one NPN transistor having emitter, base and collector incorporated in a first one of said N pockets, at least one P resistor having two terminals incorporated into a second one of said N pockets, positive and negative terminals on the body for direct connection to a D.C. supply source, and means for protecting said circuit against accidental reversal of the supply source, said protection means comprising a PNP transistor having emitter, base and collector incorporated into a third one of said N pockets, means connecting the PNP emitter and base in series between the NPN collector and the positive supply terminal, and means connecting the PNP collector to said second N pocket housing the P resistor said means connecting the PNP emitter and base being separate from said means connecting the PNP collector so that the collector of said PNP can assume a positive potential with respect to said base of said PNP transistor.

2. A monolithic integrated circuit as claimed in claim 1 wherein the protection transistor is operated in saturation.

3. A monolithic integrated circuit as claimed in claim 2 wherein the protection transistor is a lateral transistor.

4. A monolithic integrated circuit as claimed in claim 3 wherein the circuit further comprises at least second and third NPN transistors, and at least a second PNP protection transistor, means connecting the emitter-base of the second protection transistor in series between the collector of the second NPN transistor and the positive terminal, and means connecting the collector of the second protection transistor to the third NPN transistor.

5. A monolithic integrated circuit as claimed in claim 2 wherein means aree provided connecting the P substrate to the negative terminal, and means are provided connecting a terminal of the P resistor to the positive terminal.

* * * * *